United States Patent [19]

Glover

[11] Patent Number: 4,843,322

[45] Date of Patent: Jun. 27, 1989

[54] METHOD FOR PRODUCING MULTI-SLICE NMR IMAGES

[75] Inventor: Gary H. Glover, Delafield, Wis.

[73] Assignee: General Electric Company, Milwaukee, Wis.

[21] Appl. No.: 234,721

[22] Filed: Aug. 15, 1988

[51] Int. Cl.[4] .............................................. G01R 33/20
[52] U.S. Cl. ..................................... 324/309; 324/307
[58] Field of Search ............... 324/307, 309, 308, 310, 324/311, 312, 313, 314

[56] References Cited

U.S. PATENT DOCUMENTS

| | | | |
|---|---|---|---|
| 4,506,222 | 3/1985 | Edelstein et al. | 324/309 |
| 4,602,226 | 7/1986 | Vatis | 332/31 |
| 4,663,591 | 5/1987 | Pelc | 324/309 |
| 4,665,367 | 5/1987 | Kramer | 324/309 |
| 4,682,106 | 7/1987 | Vatis et al. | 324/307 |
| 4,694,254 | 9/1987 | Vatis et al. | 324/309 |
| 4,698,592 | 10/1987 | Feinberg | 324/309 |
| 4,706,026 | 11/1987 | Pelc | 324/309 |
| 4,751,462 | 6/1988 | Glover | 324/309 |

OTHER PUBLICATIONS

"SIMA: Simultaneous Multislice Acquisition of MR Images by Hadamard-encoded Excitation", S. P. Souz et al., *Journal of Computer Assisted Tomography*, pp. 1-5, 1988.

*Primary Examiner*—Michael J. Tokar
*Attorney, Agent, or Firm*—Quarles & Brady

[57] ABSTRACT

In an NMR imaging system spins in a set of slices are simultaneously excited by a composited RF excitation pulse in each NMR pulse sequence of a scan. The composite RF excitation pulse contains a set of terms, each of which excites a separate slice and each of which is modulated by a $k_y$-dependent phase factor. The $k_y$-dependent phase factor causes the iamge of each slice to be offset in the resulting reconstruction so that each slice image can be separated from the others.

2 Claims, 5 Drawing Sheets

METHOD FOR PRODUCING MULTI-SLICE NMR IMAGES

BACKGROUND OF THE INVENTION

The field of the invention is nuclear magnetic resonance imaging methods and systems. More particularly, the invention relates to a method for producing a larger number of images in a given scan time.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus). Nuclei which exhibit this phenomena are referred to herein as "spins".

When a substance such as human tissue is subjected to a uniform magnetic field (polarizing field $B_z$), the individual magnetic moments of the spins in the tissue attempt to align with this polarizing field, but precess about it in random order at their characteristic Larmor frequency. A net magnetic moment Mz is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the z-y plane to produce a net transverse magnetic moment $M_1$, which is rotating, or spinning, in the x-y plane at the Larmor frequency. The degree to which the net magnetic moment $M_z$ is tipped, and hence, the magnitude of the net transverse magnetic moment $M_1$ depends primarily on the length of time and magnitude of the applied excitation field $B_1$.

The practical value of this phenomenon resides in the signal which is emitted by the excited spins after the excitation signal $B_1$ is terminated. In simple systems the excited nuclei induce an oscillating sine wave signal in a receiving coil. The frequency of this signal is the Larmor frequency, and its initial amplitude, $A_0$, is determined by the magnitude of the transverse magnetic moment $M_1$. The amplitude, A, of the emission signal decays in an exponential fashion with time, t:

$$A = A_0 e^{-t/T^*_2}$$

The decay constant $1/T^*_2$ depends on the homogeneity of the magnetic field and on $T_2$, which is referred to as the "spin-spin relaxation" constant, or the "transverse relaxation" constant. The $T_2$ constant is inversely proportional to the exponential rate at which the aligned precession of the spins would dephase after removal of the excitation signal $B_1$ in a perfectly homogeneous field.

Another important factor which contributes to the amplitude A of the NMR signal is referred to as the spin-lattice relaxation process which is characterized by the time constant $T_1$. This is also called the longitudinal relaxation process as it describes the recovery of the net magnetic moment M to its equilibrium value along the axis of magnetic polarization (z). The $T_1$ time constant is longer than $T_2$, much longer in most substances of medical interest. If the net magnetic moment M is not given sufficient time to relax to its equilibrium value, the amplitude A of the NMR signal produced in a subsequent pulse sequence will be reduced.

The NMR measurements of particular relevance to the present invention are called "pulsed NMR measurements". Such NMR measurements are divided into a period of excitation and a period of signal emission. Such measurements are performed in a cyclic manner in which the NMR measurement is repeated many times to accumulate different data during each cycle or to make the same measurement at different locations in th subject. A wide variety of preparative excitation techniques are known which involve the application of one or more RF excitation pulses ($B_1$) of varying magnitude, frequency content and duration. Such RF excitation pulses may have a narrow frequency spectrum (selective excitation pulse), or they may have a broad frequency spectrum (nonselective excitation pulse) which produces transverse magnetization $M_1$ over a range of resonant frequencies. The prior art is replete with excitation techniques that are designed to take advantage of particular NMR phenomena and which overcome particular problems in the NMR measurement process.

When utilizing NMR to produce images, a technique is employed to obtain NMR signals from specific locations in the subject. Typically, the region which is to be imaged (region of interest) is subjected to a sequence of NMR measurement cycles which vary according to the particular localization method being used. The received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the NMR signals can be identified.

NMR has rapidly developed into an imaging modality which is utilized to obtain tomographic, projection and volumetric images of anatomical features of live human subjects. Such images depict the nuclear-spin distribution (typically protons associated with water and fat), modified by specific NMR properties of tissues, such as spin lattice ($T_1$) and spin-spin ($T_2$) relaxation time constants. They are of medical diagnostic value because they depict anatomy and allow tissue characterization.

One of the difficulties in using NMR in medical applications is the time required to acquire sufficient NMR data from which an image can be reconstructed. Many pulse sequences must be executed in order to acquire sufficient NMR data, and as indicated above, sufficient relaxation time must be allowed between successive excitations of the spin in order to produce NMR signals of appropriate amplitude A. As a result, it is common practice to acquire NMR data in a time-sequential fashion from a set of spatially-disparate slices in the region of interest so that spin magnetization can relax in one slice while the other slices are being excited. Such techniques are commonly referred to as multi-slice, two-dimensional methods. In most cases a variant of the "spin warp" data collection method is used wherein the raw data space is filled rectilinearly, and the image is produced by a simple two-dimensional Fourier transformation. Such methods are known as 2DFT methods.

The maximum number of slices which can be acquired in a given scan without extending the total scan time is determined by the duration of each pulse sequence and the relaxation time required between successive excitations of the spin in any single slice. If more relaxation time is allocated, then time is available to acquire more NMR data from other slices. Of course, the total scan time is proportionally increased and the usual practice is to keep the allocated relaxation time at the minimum amount needed to enable adequate NMR signals and contrast to be produced. And, of course, efforts are always made to reduce the length of each pulse sequence, but ultimately, a limit is reached for any given NMR measurement cycle.

SUMMARY OF THE INVENTION

The present invention relates to a method for increasing the number of slices which can be imaged with a given NMR pulse sequence, relaxation time and total scan time. More specifically, the method of the present invention is an improvement to any NMR 2DFT pulse sequence in which the image is reconstructed from the acquired NMR data using a Fourier transformation for which NMR data is simultaneously acquired from a plurality of slices by employing RF excitation pulses which are phase modulated such that the reconstructed image array includes images of each slice that are offset from each other in the phase encoding direction and can be separately displayed or stored.

A general object of the invention is to acquire NMR data from a plurality of slices simultaneously and to reconstruct an image from such data in which each slice is shown separately. If R(t) represents the RF excitation pulse envelope for a given slice in the NMR pulse sequence, then excitation with an RF pulse having the following envelope will produce a reconstructed image for that slice which is offset in the phase encoding direction (y direction) by a distance $y_0$:

$$R'(t,k_y) = R(t)e^{ik_y y_0}$$

where $k_y$ denotes the current value of the index in the phase encoding direction and is proportional to the area under the phase encoding gradient pulse. Thus, $R'(t,k_y)$ varies from view to view in contrast to normal 2DFT methods in which only the phase encoding gradient pulses vary from view to view.

Data from a series of slices can be acquired simultaneously by combining a corresponding number of such phase-offset modulation RF excitations. If $R_s(t)$ is the RF excitation pulse envelope for the $s^{th}$ slice in a desired set of N slices, then a composite RF excitation pulse $R'(t,k_y)$ will simultaneously excite all N slices with offsets $y_s$:

$$R'(t,k_y) = \sum_{s=1}^{N} R_s(t)e^{ik_y y_s}.$$

A 2DFT reconstruction of the acquired NMR data will produce an image containing all N slices. The center of the image of the $s^{th}$ slice will be offset from the center of the entire reconstructed image in the y direction by an amount $y_s$. Thus, by suitable choice of $y_s$ and a suitable reconstruction field of view in the y direction, the N slices may be displayed without overlap.

Another object of the invention is to acquire NMR data simultaneously from a set of slices and reconstruct an image of each with existing NMR systems. The transmit frequency synthesizers on existing NMR systems can be controlled to produce the composite RF excitation $R'(t,k_y)$. Similarly, the NMR data is acquired and processed using existing NMR system hardware and software. The set of slice images which are produced in the image array may be easily separated for separate display or storage.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DETAILED DESCRIPTION OF THE INVENTION

Figure 1:
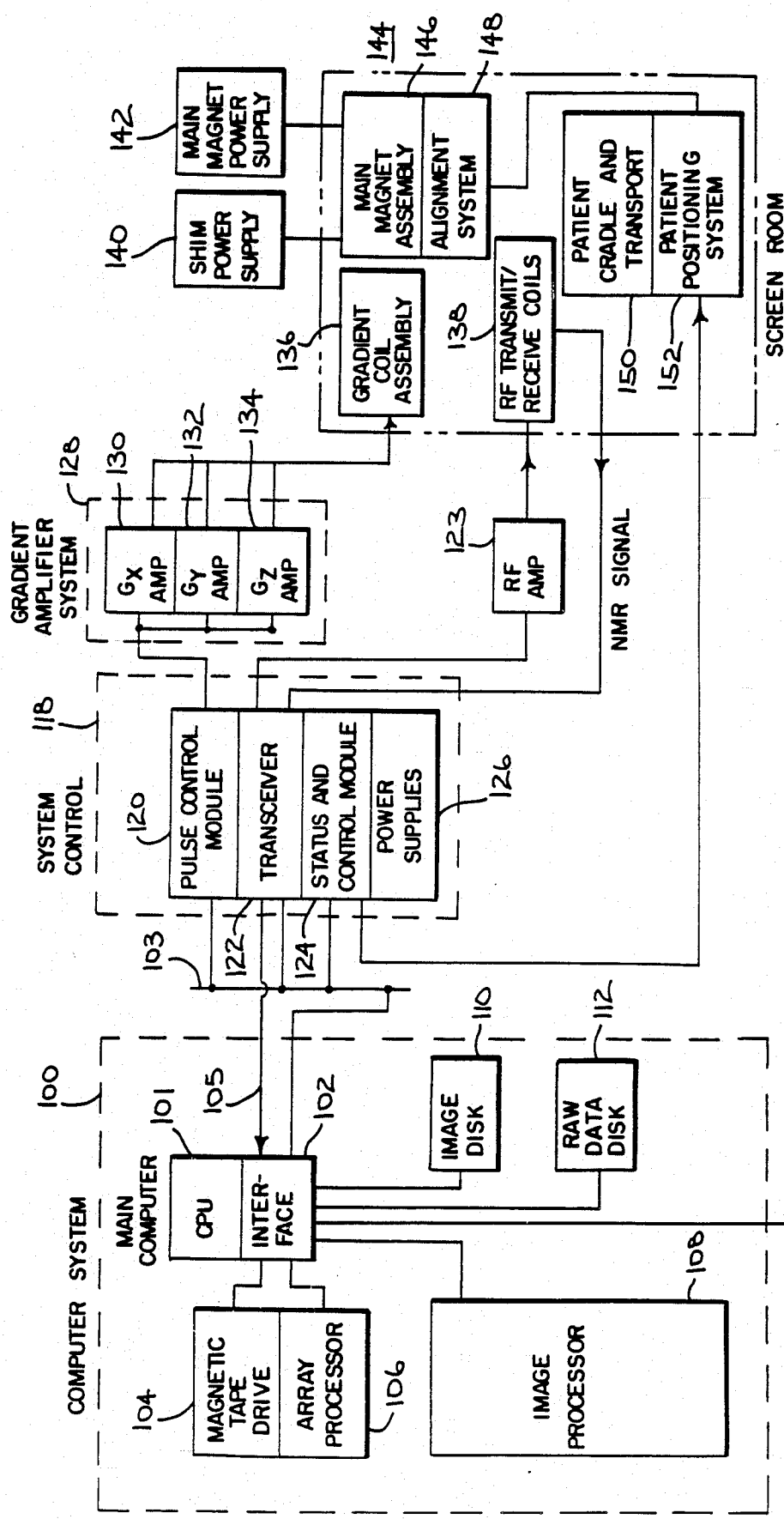
FIG. 1 is a block diagram of an NMR system which employs the present invention.

Referring first to FIG. 1, there is shown in block diagram form the major components of a preferred NMR system which incorporates the present invention and which is sold by the General Electric Company under the trademark "SIGNA". The overall operation of the system is under the control of a host computer system generally designated 100 which includes a main computer 101 (such as a Data General MV4000;). The computer has associated therewith an interface 102 through which a plurality of computer peripheral devices and other NMR system components are coupled. Among the computer peripheral devices is a magnetic tape drive 104 which may be utilized under the direction of the main computer for archiving patient data and images to tape. Processed patient data may also be stored in an image disc storage device designated 110. An array processor 6 is utilized for preprocessing data and for image reconstruction. The function of image processor 108 is to provide interactive image display manipulation such as magnification, image comparison, gray-scale adjustment and realtime data display. The computer system is provided with a means to store raw data (i.e. before image construction) utilizing a disc data storage system designated 112. An operator console 116 is also coupled to the computer by means of interface 102 and provides the operator with the means to input data pertinent to a patient study as well as additional data necessary for proper NMR system operation, such as calibrating, initiating and terminating scans. The operator console is also used to display images stored on discs or magnetic tape.

The computer system exercises control over the NMR system by means of system control 118 and gradient amplifier system 128. The computer 100 communicates with system control 118 by means of a serial digital communication network 103 (such as the Ethernet network) in a manner well known to those skilled in the art. The system control 118 includes several subsystems such as the pulse control module (PCM) 120, a radio frequency transceiver 122, a status control module (SCM) 124, and the power supplies generally designated 126 necessary to energize the components. The PCM 120 utilizes control signals provided by main computer 101 to generate digital timing and control signals such as the digital waveforms which control gradient coil excitation, as well as RF envelope waveforms utilized in the transceiver 122 for modulating the RF excitation pulses. The gradient waveforms are applied to the gradient amplifier system 128 generally comprised of $G_x$, $G_y$ and $G_z$ amplifiers 130, 132 and 134, respectively. Each amplifier 130, 132 and 134 is utilized to excite a corresponding gradient coil in an assembly generally designated 136 and which is part of a magnet assembly 146. When energized, the gradient coils generate magnetic field gradients $G_x$, $G_y$ and $G_z$ of the magnetic field in the same direction as the main polarizing magnetic field, wherein the gradients are directed in mutually orthogonal X-, Y- and Z-axis directions of a Cartesian coordinate system. That is, if the magnetic field generated by the main magnet (not shown) is directed in the z direction and is termed $B_0$, and the total magnetic field in the z direction is referred to as $B_z$, then $G_x = \partial B_z/\partial x$, $G_y = \partial B_z/\partial y$ and $G_z = \partial B_z/\partial z$, and the magnetic field at any point (x, y, z) is given by $B(x, y, z) = B_0 + G_x X + G_y Y + G_z Z$.

The gradient magnetic fields are utilized in combination with radio frequency pulses generated by transceiver 122, RF amp 128 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency waveform modulated in accordance with the control signals to an RF power amplifier 123 which then energizes RF coils 138 which are situated within main magnet assembly 146. The NMR signals radiated by the excited nuclei in the patient are sensed by the same or a different RF coil than is used for transmitting. The signals are detected, amplified, demodulated, filtered, and digitized in the receiver section of the transceiver 122. The processed signals are transmitted to the main computer 101 for processing by means of a dedicated, unidirectional, high-speed digital link 105 which links interface 102 and transceiver 122.

The PCM 120 and SCM 124 are independent subsystems both of which communicate with main computer 101, peripheral system, such as patient positioning system 152, as well as to one another by means of serial communications link 103. The PCM 120 and SCM 124 are each comprised of a 16-bit microprocessor (such as Intel 8086) for processing commands from the main computer 101. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148, a shim coil power supply 140, and a main magnet power supply 142. The shim power supply 140 is utilized to energize shim coils associated with the main magnet and which are used to correct inhomogeneities in the polarizing magnetic field. In the case of a resistive magnet, main magnet power supply 142 is utilized to continuously energize the magnet. In the case of a superconductive magnet, the main power supply 412 is utilized to bring the polarizing field produced by the magnet to the proper operating strength and is then disconnected. In the case of a permanent magnet, power supply 42 would not be needed. The patient alignment system 148 operates in combination with a patient cradle and transport system 150 and patient positioning system 152. To minimize interference from external sources, the NMR system components comprised of the main magnet assembly, the gradient coil assembly, and the RF transmit and receiver coils, as well as the patient-handling devices, are enclosed in an RF-shielded room generally designated 144.

Figure 2:
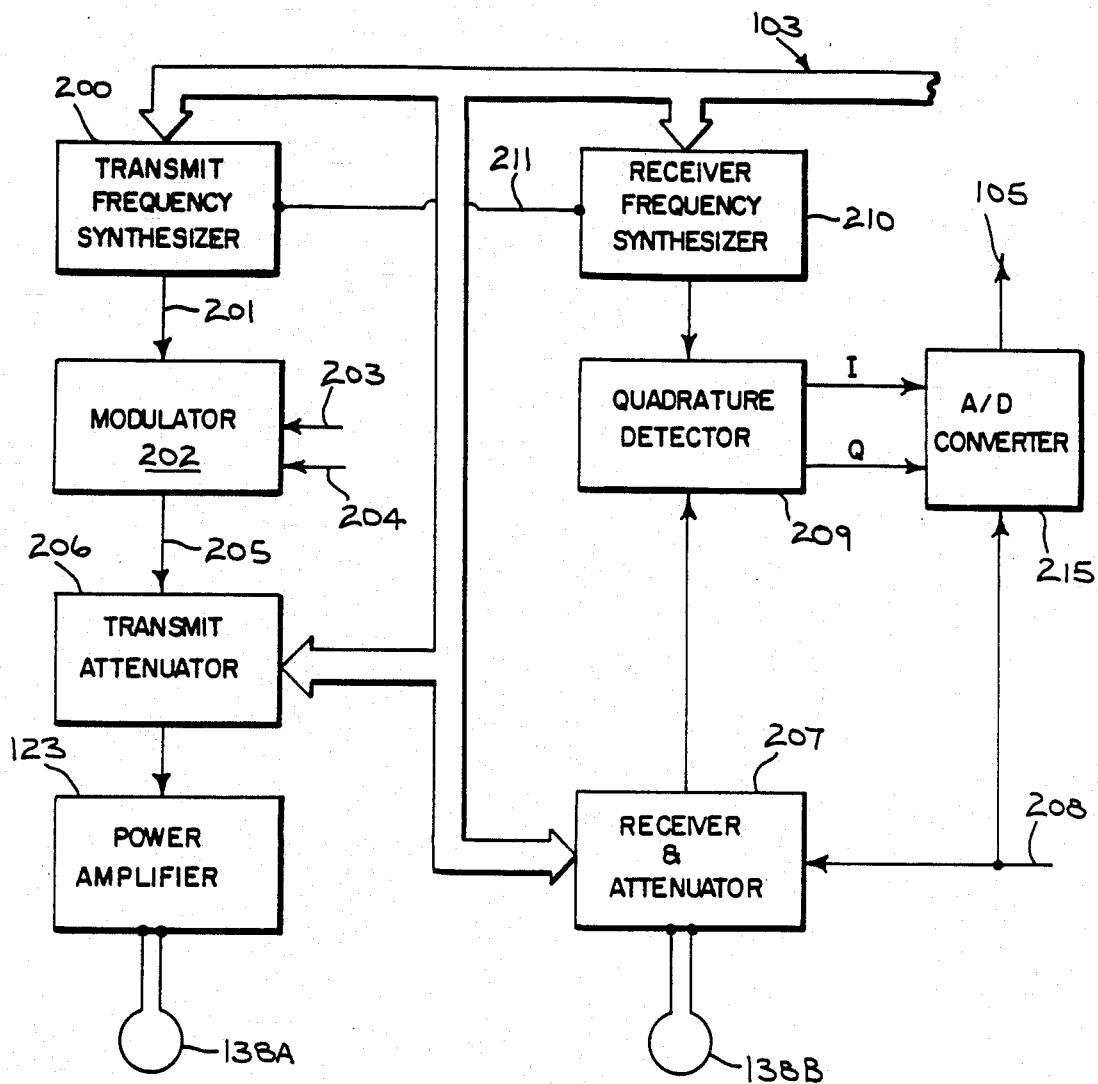
FIG. 2 is an electrical block diagram of the transceiver which forms part of the NMR system of FIG. 1.

Referring particularly to FIGS. 1 and 2, the transceiver 122 includes components which produce the RF excitation field $B_1$ through power amplifier 123 at a coil 138A and components which receive the resulting NMR signal induced in a coil 138B. The base, or carrier, frequency of the RF excitation field is produced by a frequency synthesizer 200 which receives a set of digital signals (CF) through the communications link 103 from the main computer 101. These digital signals indicate the frequency which is to be produced at an output 201 at a resolution of one Hertz. As discussed in U.S. Pat. Nos. 4,602,226; 4,694,254; and 4,682,106, which are incorporated herein by reference, the commanded RF carrier is applied to a modulator 202 where it is modulated in response to a signal R(t) received through line 203 from the PCM 120. The signal R(t) is an analog signal that defines the envelope of the RF excitation pulse to be produced. It is produced in the PCM 120 by sequentially reading out a series of stored digital values that represent the desired envelope to a digital-to-analog converter that drives the line 203. The stored digital values may, in turn, be changed by the computer 100 to enable any desired RF pulse envelope to be produced. The resulting RF excitation signal is turned on and off in response to a control signal which is also received from the PCM 120 through line 204. The magnitude of the RF excitation pulse output through line 205 is attenuated by a transmit attenuator circuit 206 which receives a digital signal, TA, from the main computer 101 through communications link 103. The attenuated RF excitation pulses are applied to the power amplifier 123 that drives the RF transmitter coil 138A.

Referring still to FIGS. 1 and 2 the NMR signal produced by the subject is picked up by the receiver coil 138B and applied to the input of a receiver 207. The receiver 207 amplifies the NMR signal and this is attenuated by an amount determined by a digital attenuation signal (RA) received from the main computer 101 through link 103. The receiver 207 is also turned on and off by a signal through line 208 from the PCM 120 such that the NMR signal is acquired only over the time intervals required by the particular acquisition being performed. The received NMR signal is demodulated by a quadrature detector 209 to produce two signals I and Q that are coupled through filters to a pair of analog to digital converters indicated collectively at 215. These A/D converters are enabled by the control line 208 to produce digitized NMR data only when a valid signal is present. This data is output to the main computer 101 through line 105. The filters at the inputs to the A/D converters are controlled by the main computer 101 to limit the bandwidth of I and Q. The quadrature detector 209 also receives an RF reference signal from a second frequency synthesizer 210 and this is employed by the quadrature detector 209 to sense the amplitude of that component of the NMR signal which is in phase with the transmitter RF carrier and the amplitude of that component of the NMR signal which is in quadrature therewith. The frequency synthesizer 210 receives digital signals (CF) through the link 103 which determine the frequency of the demodulation signal. The phase of the two synthesizers 200 and 210 is locked together through a line 211, and in most measurements, the frequency of the two synthesizers is the same.

Figure 3:
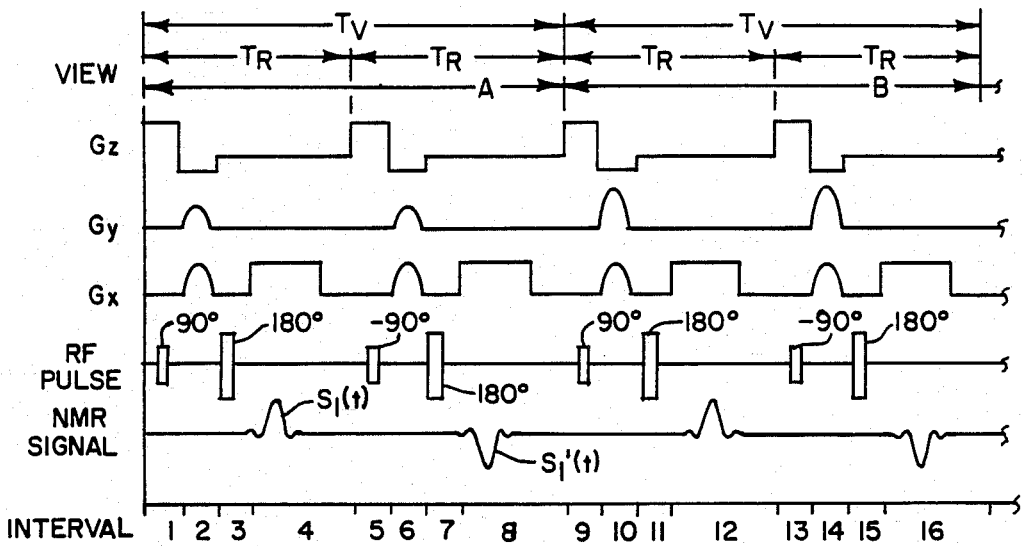
FIG. 3 is a graphic representation of a pulse sequence which may be adapted to incorporate the present invention.

Reference is made to FIG. 3 which depicts two views of a conventional imaging pulse sequence of the type known as two-dimensional Fourier transform (2DFT), and which is frequently also referred to as two-dimensional "spin-warp" imaging. This pulse sequence is useful in obtaining, in a well-known manner, imaging NMR data to reconstruct images of an object being investigated. The two views are indicated at "A" and "B" and they are identical with the exception of the phase encoding gradient field Gy. Each view is a pulse sequence which utilizes phase-alternated RF excitation pulses which, as disclosed and claimed in U.S. Pat. No. 4,443,760, produce phase-alternated NMR signals $S_1(t)$ and $S_140(t)$ to cancel certain baseline errors in the NMR system.

Referring now to View A in FIG. 3, there is shown in interval 1 (indicated along the horizontal axis) a selective 90° RF excitation pulse applied in the presence of a positive $G_z$ magnetic field gradient pulse. Pulse control module 120 provides the needed control signals to the transmit frequency synthesizer 200 and modulator 202 so that the resulting excitation pulse is of the correct phase and frequency to excite nuclear spins only in a predetermined region, or slice, of the object being imaged. Typically, the excitation pulse is amplitude modulated by a (sin x)/x function. The frequency of the synthesizer 200 is dependent on the strength of the applied polarizing magnetic field $B_0$ and the particular NMR species being imaged in accordance with the well-known Larmor equation. The pulse control module 120 also applies activating signals to the gradient amplifier 134 to generate, in this case, the $G_z$ gradient pulse.

Continuing with reference to FIG. 3, $G_x$, $G_y$ and $G_z$ gradient pulses are applied simultaneously in interval 2. The $G_z$ gradient in interval 2 is a rephasing pulse typically selected such that the time integral of the gradient waveform over interval 2 is approximately equal to $-\frac{1}{2}$ of the time integral of the $G_z$ gradient waveform over interval 1. The function of the negative $G_z$ pulse is to rephase the nuclear spins excited in the selected slice during interval 1. The $G_y$ gradient pulse is a phase encoding pulse selected to have a different amplitude in each of Views A, B, ..., etc., to encode spatial information in the direction of the gradient. The number of different $G_y$ gradient amplitudes is typically selected to equal at least the number of pixel resolution elements the reconstructed image will have in the phase encoding (Y) direction. Typically, 128, 256, or 512 different gradient amplitudes $G_y$ are selected and in the typical NMR system, the $G_y$ values are incremented a fixed amount from one view to the next until the NMR scan is complete.

The $G_x$ gradient pulse in interval 2 is a dephasing pulse needed to dephase the excited nuclear spins by a predetermined amount to delay the time of occurrence of a spin-echo signal $S_1(t)$ in interval 4. The spin-echo signal is produced typically by the application of a 180° RF pulse in interval 3. As is known, the 180° RF pulse is a spatially selective pulse which reverses the direction of spin dephasing so as to produce the spin-echo signal. The spin-echo signal is sampled in interval 4 in the presence of a gradient pulse $G_x$ to encode spatial information in the direction (X) of this gradient.

As indicated above, baseline error components are eliminated by using an additional NMR measurement in each view. This second measurement is substantially identical to the first with the exception that the RF excitation pulse in interval 5 of View A is selected to be 180° out of phase (as suggested by the minus sign) relative to the selective 90° excitation pulse in interval 1 of View A. As a result, the spin-echo signal $S_1'(t)$ in interval 8 is 180° out of phase with the spin-echo signal $S_1(t)$ in interval 4. If the signal $S_1'(t)$ is subtracted from $S_1(t)$, only those components of the signals with reversed sign in the signal $S_1'(t)$ are retained. The baseline error components thus cancel.

The process described above with reference to View A is repeated for View B and so on for all amplitudes of the phase encoding $G_y$ gradient. The NMR data which is collected during this scan is stored in the computer system 100 where it is processed to produce image data suitable for controlling a CRT display. A complete scan of this type may be used to reconstruct a two-dimensional image of one slice through the patient. The location of this slice is determined by the center frequency of the selective 90° excitation pulse and the 180° reversal pulse, and its thickness is determined by the bandwidth of the pulses and their accompanying gradient pulse strengths.

Figure 4:
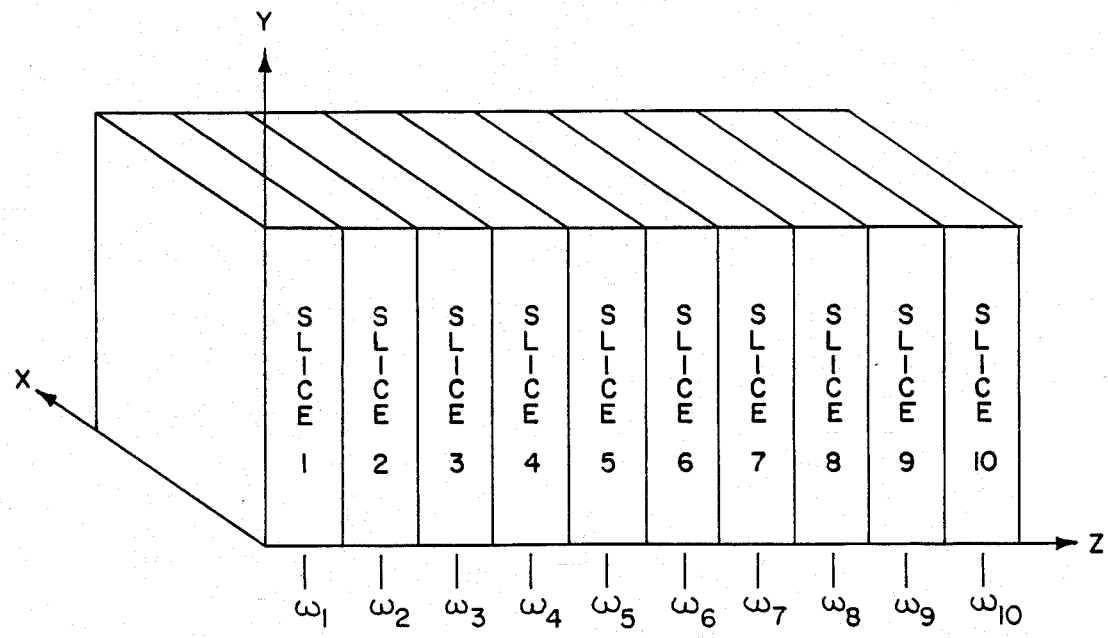
FIG. 4 is a graphic representation of a multiplanar region of interest which is scanned by the NMR system of FIG. 1.

The sequence illustrated in FIG. 3 depicts a single slice method wherein the duration of the sequence is the same as the repetition time $T_r$. However, often $T_r$ must be chosen, for contrast reasons, to be much longer than the actual time required for the sequence to acquire the data. In such cases, other slices may be excited during the relaxation period so that multiple planes are imaged for the same scan time. FIG. 4 illustrates this multiplanar technique, where the sequence time $T_s$ is now the time required to perform one sequence ($T_r$ in FIG. 3). In this example $T_s = T_r/10$ so that 10 slices are imaged. The time required to perform the scan $T_{SCAN}$ depends on the pulse sequence repetition time ($T_r$), the number of different $G_y$ phase encoding values used (n), and the number of excitations at each $G_y$ (NEX):

$$T_{SCAN}=n\cdot NEX\cdot T_r.$$

For a NEX=2 scan, such as that shown in FIG. 3, with a $T_r$ of 500 msec and n=256 phase encodings, the total scan time is 256 seconds. The number of slices which may be acquired in this scan depends on the duration ($T_s$) of each pulse sequence.

The use of a pulse sequence to acquire data from multiple planes is illustrated in FIG. 4, where NMR data is acquired from ten contiguous slices 1-10 distributed along the z axis. The data may be acquired in any order merely by changing the center frequency of the selective 90° excitation pulse to the frequency ($\omega_1-\omega_{10}$) of the next slice from which data is to be acquired. For example, the center frequency may be changed from view to view either sequentially as shown in FIG. 4, or in the following sequence $\omega_1$, $\omega_3$, $\omega_5$, $\omega_7$, 107 9, $\omega_2$, $\omega_4$, $\omega_6$, $\omega_8$, $\omega_{10}$. Acquisition of NMR data from ten slices in order to produce ten 256 by 256 pixel images might, for example, require a scan time of four minutes.

Figure 5:
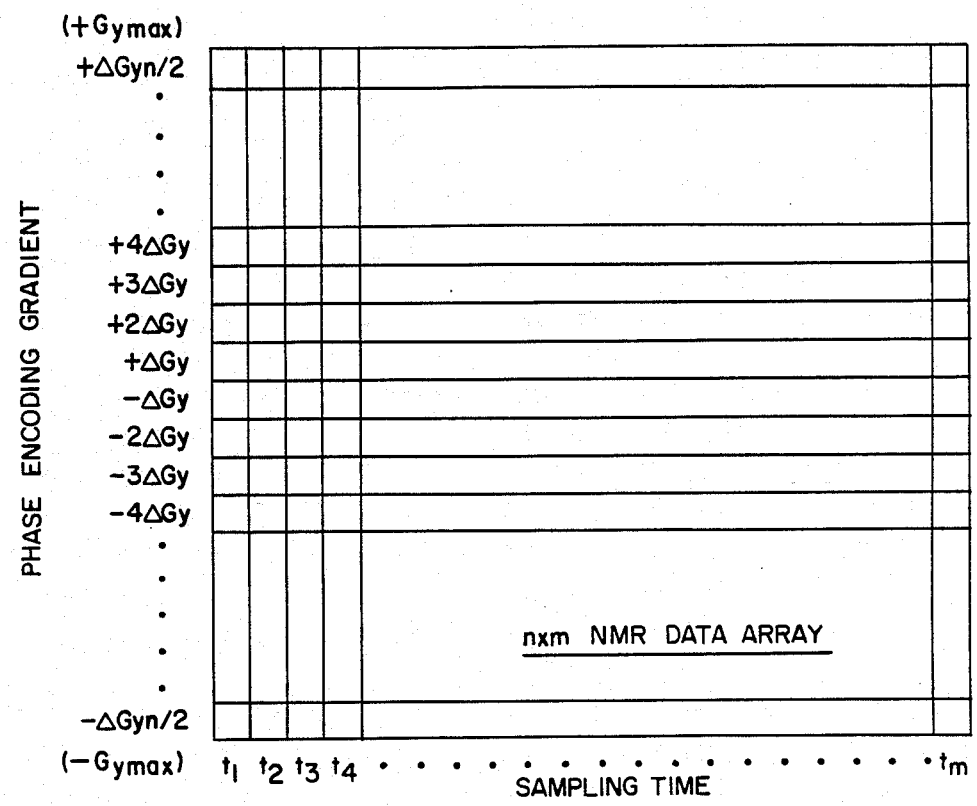
FIG. 5 is a graphic representation of an n×m NMR data array which is acquired by the NMR system of FIG. 1.

The usual NMR scan produces a data set for each slice which is comprised of two, two-dimensional arrays of digital numbers, one array representing the amplitudes of the signals from the I output of the quadrature detector and the other array representing the Q signals (FIG. 2). As shown in FIG. 5, each value in these two arrays is acquired when the phase encoding gradient field $G_y$ is at one of its discrete values ($-\Delta G_y n/2$ through $+\Delta G_y n/2$) and at one of the discrete sampling times ($t_1$ through $t_T$). By performing a complex Fourier transform on the I and Q data arrays, an array of values which indicates the intensity of pixels in a two-dimensional image is produced.

Figure 6:
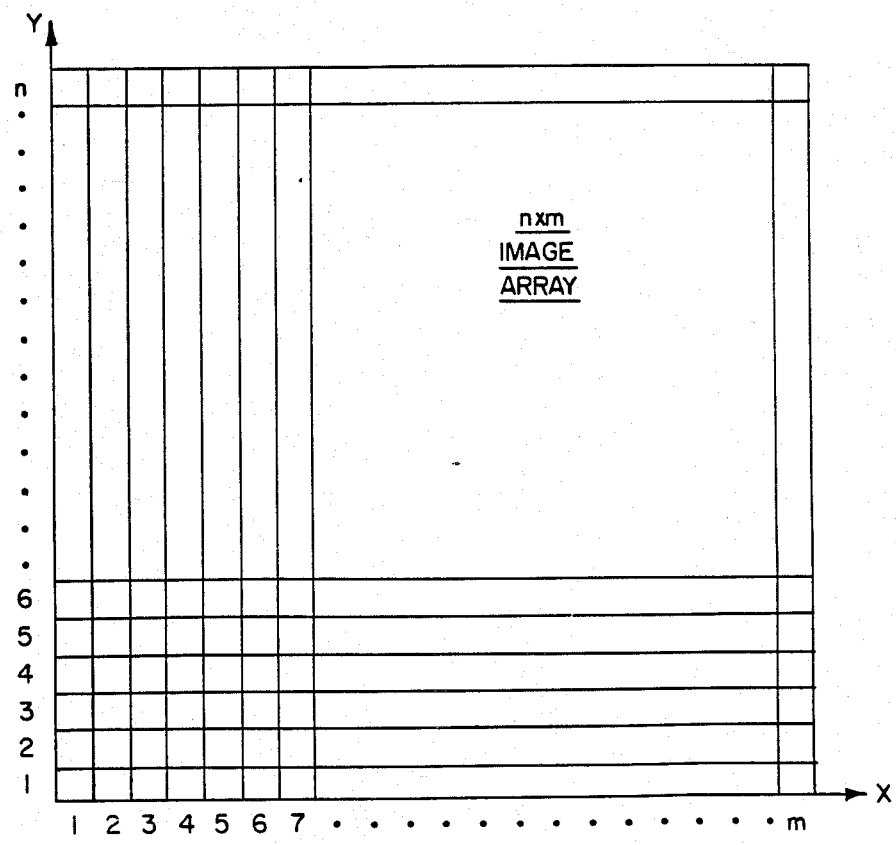
FIG. 6 is a graphic representation of an n×m image array which is produced from the NMR data array of FIG. 5 in the NMR system of FIG. 1.

Such an image array is illustrated in FIG. 6 where the number of rows along the y axis is equal to the number (n) of NMR signals acquired with different phase encoding gradient values ($G_y$) and the number of columns along the x axis is equal to the number (m) of samples taken of each NMR signal during the read period of the pulse sequence. After adding an offset to each pixel value and limiting the range of values to that of the display device being used, these pixel values can be mapped directly to a display memory array from which a human perceptible image can be produced which has n×m pixels.

Figure 7:
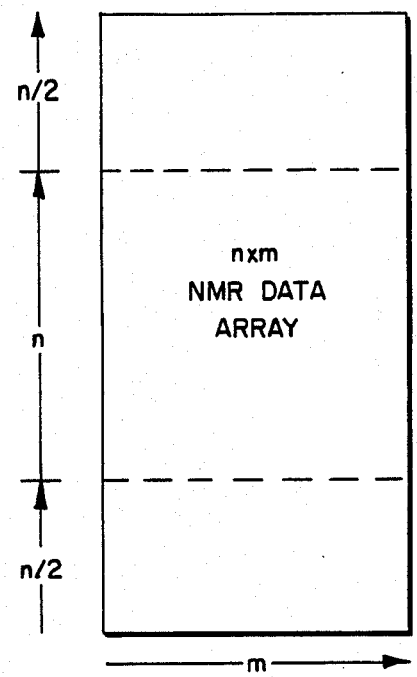
FIG. 7 is a graphic representation of an 2n×m NMR data array which is acquired by the NMR system of FIG. 1.

To overcome a problem known as "phase wrap", it is known to produce data arrays which are larger than the image arrays that are mapped to the display memory. An example is to acquire twice the number of phase encoding values as before but with $\Delta G_y$ halved. In this manner, the same total range of $G_y$ is covered but with twice the sampling in y, so that a 2n×m array of data is obtained. The resulting image array after Fourier transformation is 2n×m in size and the image occupies the entire, vertical, 2n space. As shown in FIG. 7, only the middle n×m portion of this 2n×m image array is mapped to the display memory and the top and bottom n/2×m portions are thus unused. Any wrap around images which may occur on the upper or lower boundaries of the image are thus clipped off by this over sampling technique. This technique is important to the practice of the present invention in that the Fourier transformation algorithms in existing NMR systems are capable of processing 2n ×m arrays.

The present invention is an improvement to these well known techniques which enables NMR data to be acquired from two or more times as many slices in a given scan time. The invented method may be used with nearly any existing pulse sequence which employs a slice selection RF excitation pulse as part of its imaging strategy, and it can be used with any NMR imaging system which employs a Fourier transformation of NMR data arrays into image arrays as described above.

If $F(k_y)$ is the Fourier transform of a function f(y), then we have the relationship:

$$f(y)=\int F(k_y)e^{-ik_y y}dk_y \qquad (1)$$

From a well known theorem in Fourier analysis, we also know the following:

$$f(y-y^o)=\int F'(k_y)e^{-ik_y y}dk_y \qquad (2)$$

$$\text{where: } F'(k_y)=F(k_y)e^{ik_y y_o} \qquad (3)$$

If y is the vertical position in an image which is reconstructed with a Fourier transform, then by simply multiplying F by a $k_y$-dependent phase factor, the reconstructed image can be offset, or shifted upward, by a desired amount, $y_o$.

As indicated above, in NMR imaging y represents the phase encoding direction and $k_y$ is proportional to the area under the $G_y$ phase encoding magnetic field gradient pulses. Thus, in accordance with equation (3), the image reconstructed from the NMR data can be offset in the y direction by multiplying the NMR data with a view dependent phase factor. This can be achieved by phase modulating the RF excitation pulse. For example, if R(t) represents the RF excitation pulse envelope for a given excitation, then excitation with R'(t, $k_y$) in accordance with the following expression will result in the reconstruction of the same image offset by $y_o$.

$$R'(t,k_y)=R(t)e^{ik_y y_o} \qquad (4)$$

The present invention makes use of this fact to excite two or more separate slices in the region of interest at the same time, acquire the NMR signal from both slices, and then reconstruct one image file that contains image data of both slices. By selecting the offsets large enough, one slice image is offset from the position of all other slice images such that they do not overlap. The separate slice images can, therefore, be displayed separately. In this manner, for a given scan time two or more times as many slices may be acquired and imaged.

Referring again to FIG. 3, the invention is implemented by altering the frequency and phase content of the 90° and 180° RF excitation pulses. In the preferred embodiment, two slices are excited simultaneously by these excitation pulses (N=2), however, it can be appreciated that this number may be increased if more than two slices are to be excited and produced in the same reconstructed image. The envelope for these RF excitation pulses is as follows:

$$R'(t,k_y)=R_1(t)e^{ik_y y_1}30\, R_2(t)e^{ik_y y_2} \qquad (5)$$

The mid-frequency of the envelope $R_1(t)$ is set to excite the first desired slice and the mid-frequency of the envelope $R_2(t)$ is set to excite the second desired slice. The values of $y_1$ and $y_2$ are selected such that the resulting two reconstructed images are offset from each other and do not overlap in the image array. These RF excitation pulses are produced by the transmit frequency synthesizer 200 and modulator 202 as described above with reference to FIG. 2.

If NMR data for twenty slices is to be acquired during the scan, each of the ten pulse sequences according to the preferred embodiment of the present invention acquires NMR data from two different slices. While the invention is not limited to any particular grouping of slices, in the preferred embodiment the slices are grouped contiguously as follows:

| Pulse Sequence | Slices | $R_1(t)$ | $R_2(t)$ |
|---|---|---|---|
| 1 | 1 and 2 | $\omega_1$ | $\omega_2$ |
| 2 | 5 and 6 | $\omega_5$ | $\omega_6$ |
| 3 | 9 and 10 | $\omega_9$ | $\omega_{10}$ |
| 4 | 13 and 14 | $\omega_{13}$ | $\omega_{14}$ |
| 5 | 17 and 18 | $\omega_{17}$ | $\omega_{18}$ |
| 6 | 3 and 4 | $\omega_3$ | $\omega_4$ |
| 7 | 7 and 8 | $\omega_7$ | $\omega_8$ |
| 8 | 11 and 12 | $\omega_{11}$ | $\omega_{12}$ |
| 9 | 15 and 16 | $\omega_{15}$ | $\omega_{16}$ |
| 10 | 19 and 20 | $\omega_{19}$ | $\omega_{20}$ |

It should be apparent that NMR data can be acquired from all twenty slices in ten pulse sequences instead of the usual ten slices. The sequence is repeated with 2n different values of phase encoding gradient $G_y$ and consequent values of $k_y$ until the scan is complete. A $2n \times m$ array of data from both the I and Q outputs of the quadrature detector 209 (FIG. 2) is thus obtained for each pair of slices.

Figure 8:
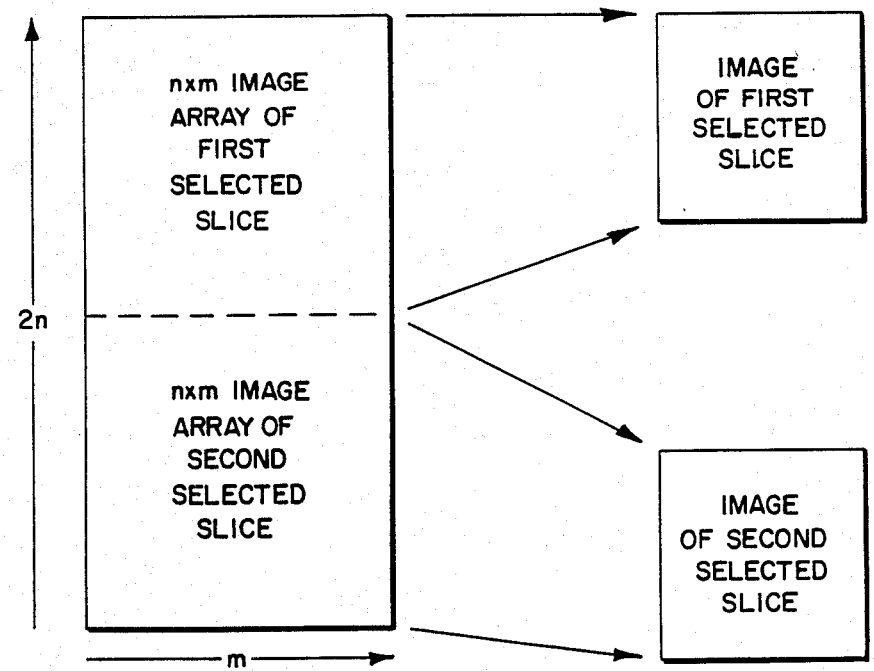
FIG. 8 is a graphic representation of a 2n×m image array which is produced from the data array of FIG. 7 when the method of the present invention is employed in the NMR system of FIG. 1.

Processing of the acquired NMR data is carried out in the usual fashion. The I and Q $2n \times m$ data arrays undergo complex Fourier transformations to produceaa $2n \times m$ image array. As shown in FIG. 8, however, the $2n \times m$ image array now contains two separate $n \times m$ images of the paired slices. These can be separately mapped to the $n \times m$ display memory or they can be separately stored for later use.

It should be apparent to those skilled in the art that the invention is not limited to the simultaneous acquisition of data from two slices. Additional frequency and phase components can be added to the RF excitation signals to excite numerous slices at the same time. Of course, the phase offsets ($y_1$, $y_2$... $y$) of these components must be large enough that the reconstructed images will not overlap, and the data arrays and image arrays must be large enough to store all of the offset images. This can be assured by increasing the total number of acquisitions by the same factor N by which the slices are combined in accordance with the teachings of the present invention. Thus, if N-fold signal averaging (i.e. multiple NEX) acquisitions are performed in a conventional scan for signal to noise improvement, that sequence can be easily altered to produce N times as many slices in each reconstructed image, each with the expected signal-to-noise advantage of N fold averaging.

In some cases, the reconstructed image of the object which is obtained during conventional scanning does not fill the entire vertical extent, or field of view, of the $n \times m$ matrix. This can be achieved either by suitable choice of the field of view relative to the object extent, or by limiting the extent of the image using, for example, selective presaturating RF pulses to desensitize spins near the top and bottom of the object. It may be possible, therefore, to adequately represent the reconstructed object with half or less of the n vertical picture elements. In such cases, the invention may be practiced without requiring N-fold averaging. For example, if the object is only n/2 elements high, then two slices may be simultaneously excited and reconstructed in the $n \times m$ matrix for separation into two $n/2 \times m$ pictures.

I claim:

1. In an NMR system for producing images by Fourier transformation of an NMR data set acquired from a set of NMR pulse sequences in which a phase encoding magnetic field gradient is stepped through a corresponding set of discrete values, the improved method comprising:
   applying a composite RF excitation pulse during each NMR pulse sequence which contains a plurality of pulse envelope terms multiplied by a sequence number dependent phase factor, and which excites spins in a plurality of slices which are selected by the frequency of a respective one of said plurality of pulse envelope terms in the composite RF excitation pulse;
   performing a Fourier transform on the NMR data set which is acquired by the set of NMR pulse sequences to produce an image array; and
   separating the slice imgges contained in the image array to produce a separate image array for each of said plurality of slices.

2. The improvement as recited in claim 1 in which the composite RF excitation pulse is expressed as follows:

$$R'(t,k_y) = \sum_{s=1}^{N} R_s(t) e^{ik_y y_s}$$

where:
   $R_s(t)$ is the pulse envelope for each term,
   N is the number of slices in which spins are simultaneously excited,
   $k_y$ is a sequence number dependent factor, and
   $y_s$ is a desired amount of offset which enables the slice image to be separated.

* * * * *